US007295315B2

(12) United States Patent
Johnson

(10) Patent No.: US 7,295,315 B2
(45) Date of Patent: Nov. 13, 2007

(54) FOCUS AND ALIGNMENT SENSORS AND METHODS FOR USE WITH SCANNING MICROLENS-ARRAY PRINTER

(75) Inventor: Kenneth C. Johnson, 2502 Robertson Rd., Santa Clara, CA (US) 95051

(73) Assignee: Kenneth C. Johnson, Santa Clara, CA (US)

( * ) Notice: Subject to any disclaimer, the term of this patent is extended or adjusted under 35 U.S.C. 154(b) by 126 days.

(21) Appl. No.: 10/871,101

(22) Filed: Jun. 18, 2004

(65) Prior Publication Data

US 2004/0263860 A1    Dec. 30, 2004

Related U.S. Application Data

(60) Provisional application No. 60/483,701, filed on Jun. 30, 2003.

(51) Int. Cl.
*G01B 11/00* (2006.01)
(52) U.S. Cl. .................................................... 356/401
(58) Field of Classification Search ................. 356/499
See application file for complete search history.

(56) References Cited

U.S. PATENT DOCUMENTS

| | | | | |
|---|---|---|---|---|
| 5,448,356 | A | * | 9/1995 | Yoshii et al. ................ 356/499 |
| 5,569,913 | A | * | 10/1996 | Ishizuka et al. .......... 250/237 G |
| 5,977,539 | A | * | 11/1999 | Holzapfel et al. ....... 250/237 G |
| 6,133,986 | A | | 10/2000 | Johnson |
| 6,259,531 | B1 | * | 7/2001 | Takamiya et al. ........... 356/499 |
| 6,392,752 | B1 | | 5/2002 | Johnson |
| 6,424,404 | B1 | | 7/2002 | Johnson |
| 6,498,685 | B1 | | 12/2002 | Johnson |
| 6,628,390 | B1 | | 9/2003 | Johnson |
| 6,643,025 | B2 | * | 11/2003 | Degertekin et al. ......... 356/505 |

OTHER PUBLICATIONS

Hsu-Ting Huang, Gayathri Raghavendra, Apo Sezginer, Kenneth Johnson, Fred Stanke, Michelle Zimmerman, Cristina Cheung, Makoto Miyagi, Bhanwar Singh., "Scatterometry-Based Overlay Metrology," *Proc. SPIE*, 5038:126-137 (2003).

* cited by examiner

*Primary Examiner*—Gregory J. Toatley, Jr.
*Assistant Examiner*—Isiaka O. Akanbi
(74) *Attorney, Agent, or Firm*—Townsend and Townsend and Crew, LLP

(57) ABSTRACT

A scanning microlens-array printer comprises an optical focus/alignment subsystem in which the optical sensor elements are integrated within a microlens printhead unit. The unit also incorporates an integrated spatial light modulator; thus the printhead incorporates all the critical optomechanical components necessary for high-resolution, maskless, lithographic printing. Alignment is detected by an interferometric process in which a reference diffraction grating on a printing surface coherently combines two optical beams to generate an interference signal that is sensitive to the grating's lateral position. Focus sensing is effected by using the reference grating to divide a normally-incident convergent beam into two obliquely-directed reflected beams, and detecting the focus-induced translational shift in the reflected beams' focal points.

25 Claims, 7 Drawing Sheets

FOCUS AND ALIGNMENT SENSORS AND METHODS FOR USE WITH SCANNING MICROLENS-ARRAY PRINTER

CROSS REFERENCE TO RELATED APPLICATIONS

This application claims priority from U.S. Provisional Patent Application Ser. No. 60/483,701, filed Jun. 30, 2003, for "Scanning Microlen-Array Printer with Integrated Focus/Alignment Sensor", the entire disclosure of which is incorporated by reference.

BACKGROUND OF THE INVENTION

The present invention relates generally to position sensing and more specifically to optically determining focus and lateral (transverse) position. This could be used, for example, to focus and align a printhead with respect to a printing substrate.

Microlens-scanner exposure systems are being developed for high-resolution, maskless lithography applications. (See, for example, U.S. Pat. Nos. 6,133,986, 6,424,404, and 6,498,685.) A microlens-scanner system, uses a microlens array to focus illumination onto an array of diffraction-limited focal spots, which are scanned across a printing surface as the spots are intensity-modulated to synthesize a high-resolution latent image in a photosensitive medium. The spots are modulated by means of a digitally-controlled spatial light modulator (SLM), which may be imaged onto the microlens array by means of projection optics, or may alternatively be incorporated within the microlens array itself.

The microlens arrays and associated Microsystems, such as sensors and micro-positioning actuators, are formed on planar "printhead" structures. The scanning motion may be effected by moving either the printheads or the printing surface, but in either case fine-alignment positioning could be done with position sensors and servomechanisms formed integrally with the printhead.

There are advantages to putting much of the system functionality into the printheads. For example, the projection optics can be eliminated by integrating the SLM into the printhead. With an integrated SLM, the optics external to the printhead need only provide illumination of sufficient uniformity and collimation. (There is no need for stringent alignment tolerances in the illumination optics.) Furthermore, an integrated SLM eliminates optical cross talk between SLM pixels, and also makes it possible to operate multiple printheads in parallel with a single illumination source. There are also benefits to placing the focus and fine-alignment sensors and actuators on the printhead in close proximity to the exposure microlenses. The fine-positioning servomechanism would not need to drive large masses or maintain stringent positioning tolerances between multiple monolithic elements (stages, lenses, etc.) spanning large distances; and the close coupling between all the critical system components—position sensors, actuators, and exposure microlenses—would eliminate tolerance stack-up in the focus/alignment servomechanism, enabling very accurate and responsive position tracking while also simplifying the system.

Maskless lithography with improved focus/alignment control could make the use of multi-level etch masks practical for achieving print resolution far beyond the optical limit. The method is described in U.S. Pat. No. 6,133,986 (see FIGS. 11a–f, 12 and 13 in '986), and is illustrated in FIGS. 1, 2A and 2B herein. FIG. 1 illustrates a semiconductor wafer substrate 101, lower planarization layer 102, lower etch mask layer 103, upper planarization layer 104, and upper etch mask layer 105. The mask layers are lithographically patterned, using high-contrast, high-$k_1$, imaging to obtain accurate edge placement; and the two mask layers are used to etch narrow trenches in the substrate (e.g. trench 106) with trench widths much smaller than the optical resolution limit. FIGS. 2A and 2B illustrate a similar process for forming sub-resolution etched lines. In this example, the upper and lower mask edges overlap and the upper mask is used to selectively remove the middle portion of each lower mask line (e.g., portion 201 is removed from line 202, leaving the portions 203 and 204 shadowed by the upper mask—see FIG. 2A). The lower mask is then used to etch narrow lines in the substrate (e.g. line 205, FIG. 2B). For this type of application the extra cost incurred by the multiple etch masks would be mitigated by using maskless lithography, and printhead-integrated focus/alignment controls could achieve the very stringent mask overlay tolerances that would be required.

Several types of focus/alignment mechanisms are discussed in the prior art. U.S. Pat. No. 6,133,986 describes a parallel-confocal, Moire imaging technique for simultaneously measuring focus and alignment. U.S. Pat. Nos. 6,392,752 and 6,628,390 describe microlens imaging and position-sensing mechanisms that employ optical phase-contrast methods for improved sensitivity. U.S. Pat. No. 6,498,685 mentions the use of capacitance sensors and other types of proximal probes for focus and alignment tracking. Similar systems are employed in commercial position encoder systems—for example, NanoWave Inc. (www.nanowave.com) manufactures optical and capacitance-probe encoders exhibiting subnanometer measurement resolution. These systems employ grating targets, similar to the mechanisms described in the aforementioned patent disclosures.

Alignment tracking is similar, in some respects, to overlay metrology, which is a post-process measurement of alignment error. A technique for measuring overlay by detecting phase contrast in overlapping diffraction gratings is described in "Scatterometry-based overlay metrology," Proc. SPIE, vol. 5038, 126–137 (2003). This method exhibits subnanometer measurement resolution, an order of magnitude better than imaging-based methods. The method uses gratings formed on the test device with fixed positional relationships, and is therefore not directly applicable to alignment tracking; however it illustrates the kind of measurement capability that is possible with phase-contrast optical detection methods.

SUMMARY OF THE INVENTION

The present invention provides alignment and focusing techniques that are suitable for use in such applications as a scanning microlens-array printer.

In one aspect of the invention, an alignment sensor for use with a reference grating disposed on a substrate comprises first and second sensor gratings and an optical detector. The first and second sensor gratings and the optical detector are laterally spaced on opposite sides of the detector such that when the sensor gratings receive illumination, each sensor grating diffracts at least some of the illumination into at least one obliquely transmitted beam directed at the reference grating. Further, the reference grating receives two transmitted beams, one from each sensor grating, and diffracts the transmitted beams into a combined reflected beam, and the detector receives the reflected beam and produces an optical interference signal that is sensitive to the reference grating's lateral position relative to the alignment sensor.

In another aspect of the invention, an alignment method for use with a reference grating disposed on a substrate comprises illuminating first and second laterally spaced sensor gratings with illumination so that each sensor grating diffracts at least some of the coherent illumination into at least one obliquely transmitted beam and directing two transmitted beams, one from each sensor grating, to a common region of the reference grating. The reference grating receives the two transmitted beams and diffracts the transmitted beams into a combined reflected beam, which is optically detected to produce an interference signal that is sensitive to the reference grating's lateral position relative to the sensor gratings.

Some embodiments further include third and fourth sensor gratings that are laterally spaced on opposite sides of the detector along an axis that is perpendicular to the axis along which the first and second sensor gratings are laterally spaced on opposite sides of the detector. This enables the alignment sensor to be used with reference gratings having either of two grating line orientations.

Other embodiments further include an additional sensor grating and an additional optical detector disposed proximate to the second sensor grating so that the second sensor grating is shared by two alignment sensors. In these embodiments, the first-mentioned detector is located between the first and second sensor gratings so that the first-mentioned detector, the first sensor grating, and the second sensor grating define together a first alignment sensor, and the additional detector is located between the second sensor grating and the additional sensor grating so that the additional detector, the second sensor grating, and the additional sensor grating define together an additional alignment sensor.

In another aspect of the invention, a focus sensor for use with a reference grating disposed on a substrate comprises a microlens and one or more position-sensing detectors. The microlens receives illumination and focuses the illumination into a converging, transmitted beam, and the reference grating receives the transmitted beam and diffracts the transmitted beam into one or more obliquely reflected beams. The microlens and position-sensing detector or detectors are disposed relative to one another such that the or each position-sensing detector receives one of the reflected beams, which comes to a focus on or near that detector, and the detector generates signals that are sensitive to translational shifts of the reflected beam induced by changes in separation distance between the reference grating and the focus sensor.

Alternatively, a focus sensor that does not require a reference grating on the substrate comprises a focusing/beam-splitting component and two or more position-sensing detectors. The focusing/beam-splitting component receives illumination and directs two or more converging beams toward the substrate at oblique angles. The reflecting surface receives the converging beams and reflects them into obliquely reflected beams. Each position-sensing detector receives one of the reflected beams, which comes to a focus on or near the position-sensing detector, and the position-sensing detector generates a signal that is sensitive to translational shifts of the corresponding reflected beam induced by changes in separation distance between the substrate and the focus sensor.

The focusing/beam-splitting component could, for example, comprise a diffraction grating in series with a focusing component, which could, for example, comprise a microlens. Alternatively, beam splitting and focusing could be accomplished by a single diffractive element that performs both functions.

The position-sensing detectors could comprise split detectors. A split detector comprises two proximate detector elements that generate separate intensity signals. As the focused beam moves laterally on the split detector, the balance between the split detector signals varies in relation to the beam position.

In another aspect of the invention, a focus method for use with a substrate comprises directing an incident, converging beam toward the substrate to generate a reflected beam traveling away from the substrate surface at an oblique angle, and detecting light from the reflected beam with a position-sensitive optical detector (e.g., a split detector) located near the reflected beam's focus. The beam's focus position on the detector is sensitive to the reflecting surface's position relative to the incident beam.

The method could include generating an additional reflected beam, and detecting light from the additional reflected beam with an additional position-sensitive optical detector located near the additional reflected beam's focus. The multiple reflected beams may be generated by splitting an incident beam by means of a diffraction grating on the substrate, or by generating multiple incident beams by means of a focusing/beam-splitting component such as a microlens-grating combination.

An array of alignment sensor mechanisms of the type described above can be used to obtain a precise measure of alignment position relative to a common reference grating on a printing surface. The mechanisms have different built-in phase offsets of their sensor gratings relative to the reference grating. Two reference gratings with different line orientations are used to provide two-dimensional alignment tracking capability. Also, the alignment reference grating may be used as a focus reference surface in the above-described manner.

In some embodiments, a maskless lithography system comprises printheads that incorporate all of the system's critical focus/alignment elements, including sensor optics (e.g. microlenses), optical detectors, and fine-positioning actuators. (In prior-art systems the detector elements are external to the printheads. This necessitates the use of imaging optics between the printheads and the detector elements and requires optical alignment of the printheads, imaging optics, and detector elements.) If the printheads also have internal SLM's, the exposure system becomes very simple because all of its critical optomechanical components—the exposure microlenses, the SLM's, the focus/alignment sensor optics and detectors, and fine-positioning actuators—are integrated in the printheads. The system components external to the printheads include two illumination sources (one for exposure and one for focus/alignment tracking), a scanning stage with coarse positioning capability, an SLM data source for pattern generation, and control electronics. There are no projection optics or critical positioning servomechanisms external to the printheads.

A further understanding of the nature and advantages of the present invention may be realized by reference to the remaining portions of the specification and the drawings.

DESCRIPTION OF SPECIFIC EMBODIMENTS

Figure 1:
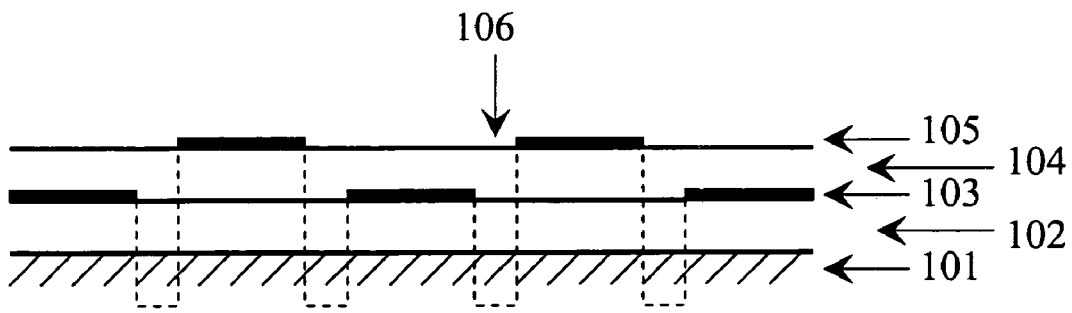
FIGS. 1, 2A, and 2B illustrate a multi-level etch mask process for achieving lithographic print resolution higher than the exposure system's optical resolution.
Figure 2A:
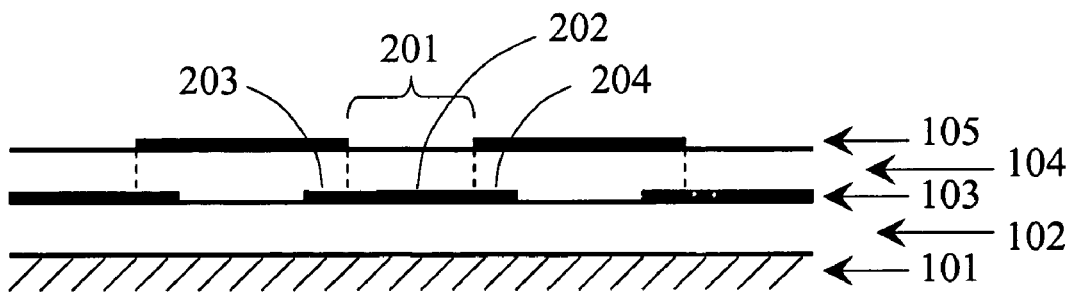
Figure 2B:
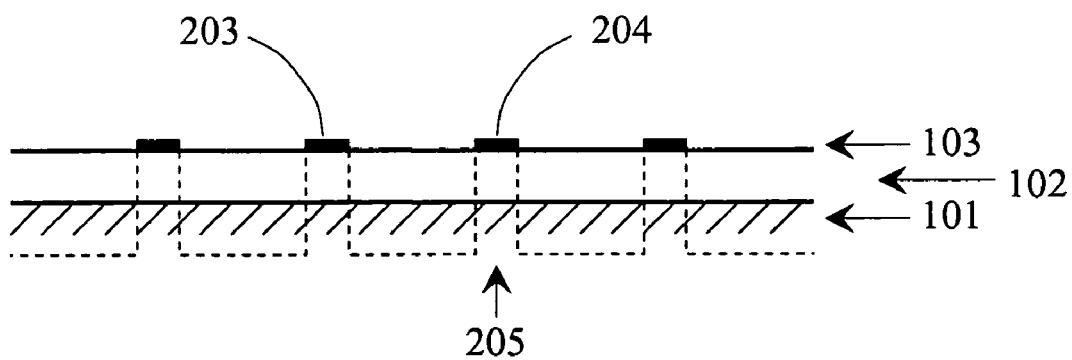
Figure 3:
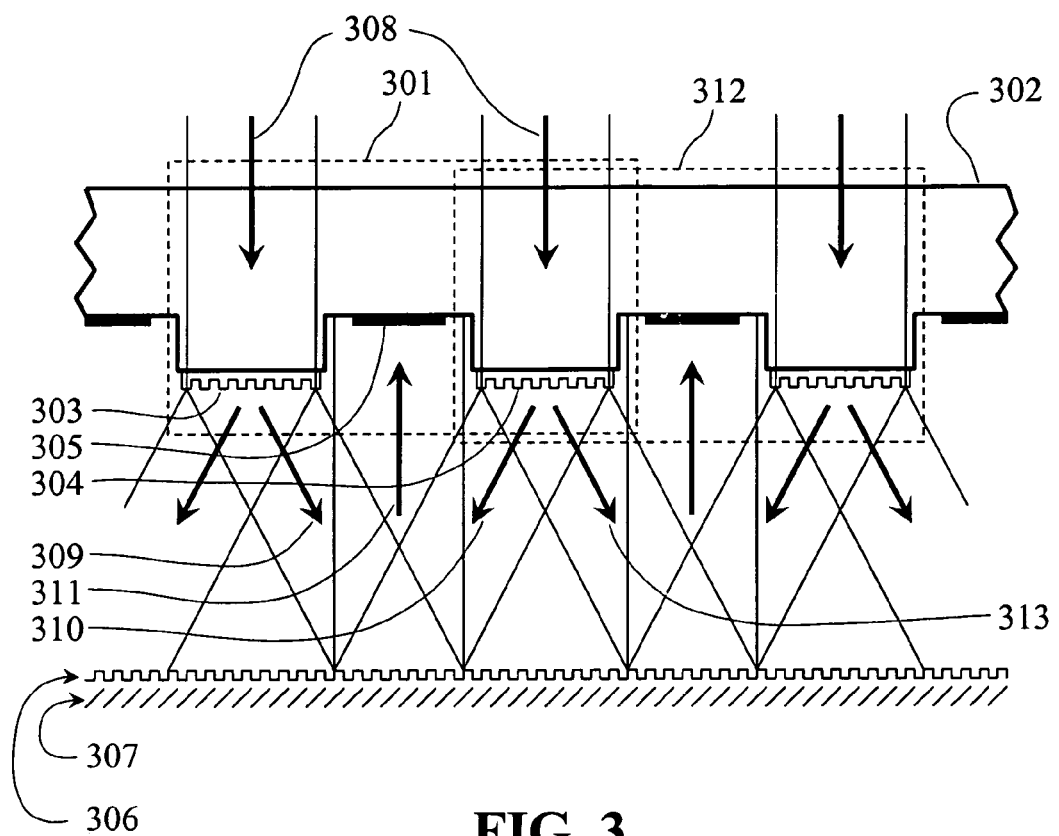
FIG. 3 illustrates an alignment sensor mechanism.

A preferred embodiment of the alignment sensor mechanism is illustrated cross-sectionally in FIG. 3. The sensor mechanism 301 is disposed on a printhead 302 and comprises two transmission diffraction gratings 303 and 304 and an optical detector element 305 between the gratings. (Detector element 305 is preferably either recessed in the printhead, as illustrated in FIG. 3, or provided with light baffles to shield it from stray light.) A third grating 306 (a reflection grating) is disposed on a portion of a printing substrate 307 to serve as an alignment reference. The system uses line gratings, which are shown cross-sectionally in FIG. 3. The gratings all have substantially identical line orientations and grating periods. Collimated incident illumination 308 is diffracted by sensor gratings 303 and 304 into obliquely-transmitted beams 309 and 310, and is then diffracted by reference grating 306 so that beams 309 and 310 are coherently combined in the reflected beam 311.

The reflected beam illuminates detector element 305. The phase relationship between the portions of combined beam 311 originating from beams 309 and 310 is dependent on the lateral position of reference grating 306 relative to sensor gratings 303 and 304, resulting in optical interference that can vary from complete constructive to complete destructive interference. Thus, the detector signal is very sensitive to the reference grating's lateral position in the direction transverse to the grating lines. Although the sensor mechanism relies on phase coherence effects, it does not necessarily require coherent or monochromatic illumination. This is because the reflected beam's diffraction angle is wavelength-independent, by symmetry; and the phase shift, which is proportional to the ratio of the lateral positional shift to the grating period, is also independent of wavelength.

An array of alignment sensor mechanisms such as mechanism 301 is used to accurately track lateral alignment. FIG. 3 illustrates a portion of an array comprising two such mechanisms 301 and 312. The sensor gratings can be shared by adjacent sensor mechanisms. For example, grating 304 is shared by mechanisms 301 and 312, with each mechanism receiving one of two diffracted beams 310 and 313 generated by grating 304.

The sensor mechanisms are configured to have different phase offsets of their gratings (e.g., 303 and 304) relative to the reference grating 306. The signal from any particular detector element will exhibit minimal sensitivity to alignment position when the phase interference is maximally destructive or maximally constructive, and the differing phase offsets ensure that this condition does not occur simultaneously for all detector signals.

The sensor gratings' phase offsets and diffraction efficiencies do not necessarily need to be controlled to stringent tolerances, because their relative phase offsets and efficiencies can be calibrated from data acquired as the sensor mechanism scans a reference grating. However, the reference grating 306 should be fabricated to stringent phase tolerances. The reference grating should preferably be fabricated using interference lithography to achieve the highest possible tolerance control. (Alternatively, it could be formed by proximity printing or by imprint lithography from a master grating that has been generated by interference lithography.)

The phase offsets in the sensor gratings could be effected by one of several methods: (1) by controlling the lateral positional offset of the grating lines to induce a desired phase offset, (2) by forming the sensor gratings with their grating period or orientation differing slightly from the reference grating (in which case the induced phase offsets would create a Moire pattern in the signal distribution across the detector array), or (3) by forming the sensor gratings at different height levels. (The first approach is simplest, but the latter two approaches would be more compatible with interference lithography.)

Figure 4A:
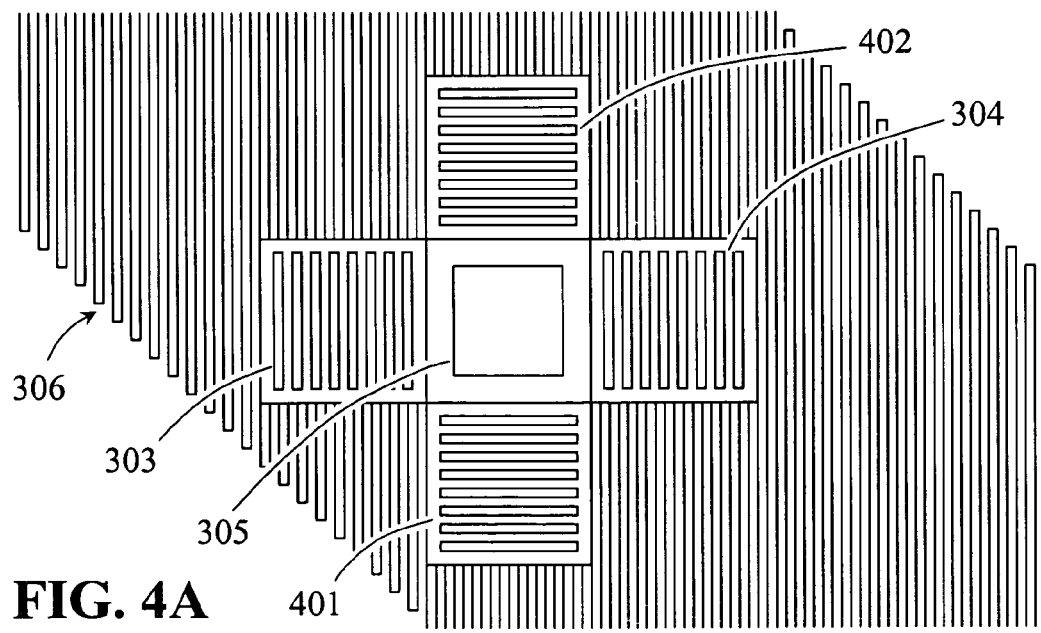
FIGS. 4A and 4B illustrate an alignment sensor mechanism configured to operate with reference gratings having either of two grating orientations.
Figure 4B:
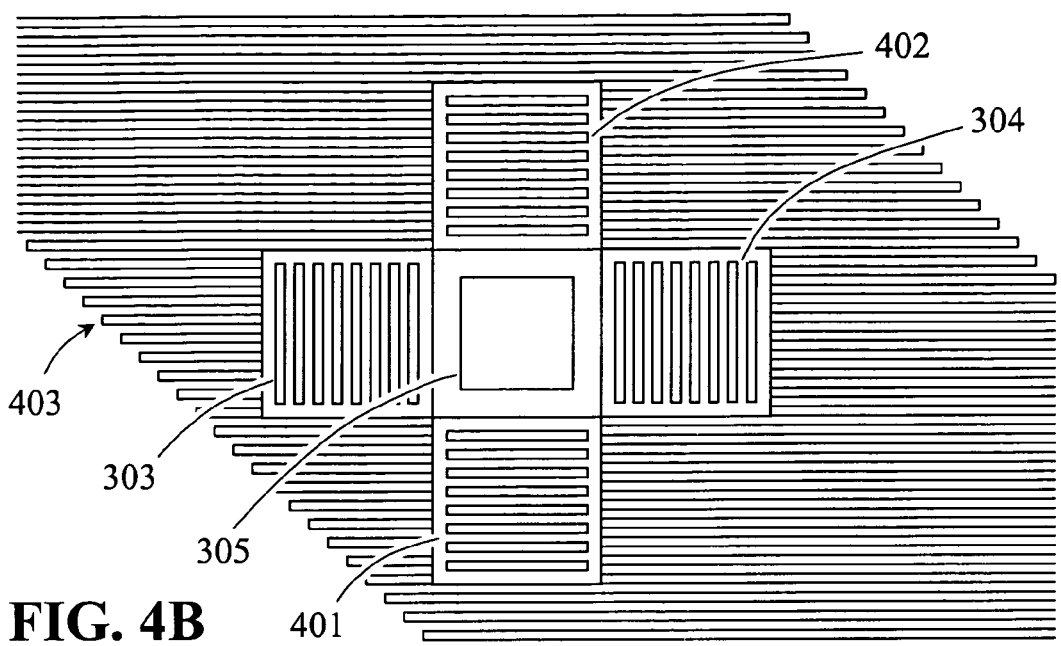

The alignment sensor illustrated in FIG. 3 is insensitive to lateral displacements of the reference grating in the direction parallel to the grating lines, so two sets of sensors and associated reference gratings, with the two sets having transverse grating line orientations, would be required to obtain two-dimensional alignment information. The sensor mechanism may be configured so that it can operate with a reference grating having either of two grating orientations, as illustrated in FIGS. 4A and 4B. FIG. 4A is a plan view of the mechanism showing the sensor gratings 303 and 304, the detector element 305, and the reference grating 306. Two additional sensor gratings 401 and 402 are provided for operation with a second reference grating 403 (FIG. 4B) having a line orientation transverse to grating 306. In FIG. 4A gratings 401 and 402 are inoperative (i.e. the light transmitted through the gratings does not intercept the detector). With the transverse reference grating orientation of FIG. 4B, however, gratings 401 and 402 replace the function of gratings 303 and 304 in FIG. 3, while gratings 303 and 304 become inoperative.

Figure 5:
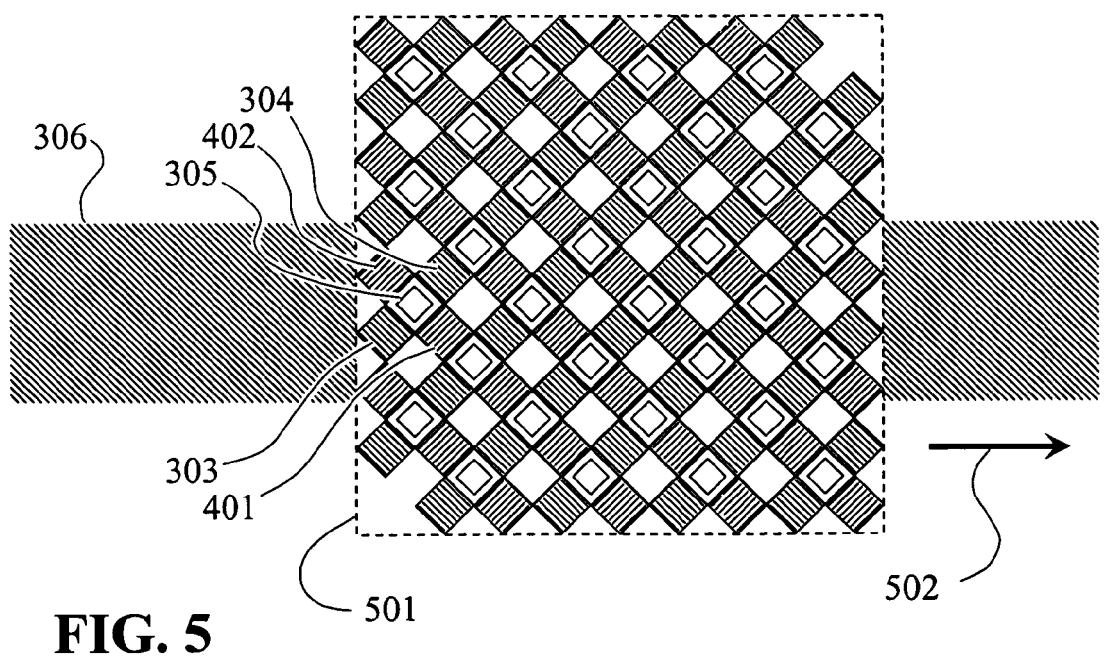
FIG. 5 illustrates an alignment sensor array.

FIG. 5 illustrates a portion of an array of alignment sensors 501 positioned above reference grating 306. Another portion of the array (not shown) would be positioned over a second reference grating having a transverse line orientation. The sensors operate in conjunction with a positioning servomechanism to maintain alignment and synchronize pattern generation as the printing substrate bearing the reference gratings (or the printhead bearing the sensor array) is scanned in direction 502. In addition to controlling translational alignment, the alignment system would control rotational alignment between the printhead and printing substrate, and may also dynamically control the thermal distribution in the printhead or printing substrate (e.g., by means of controlled radiative or resistive heating) to minimize alignment errors induced by thermal expansion.

Figure 6:
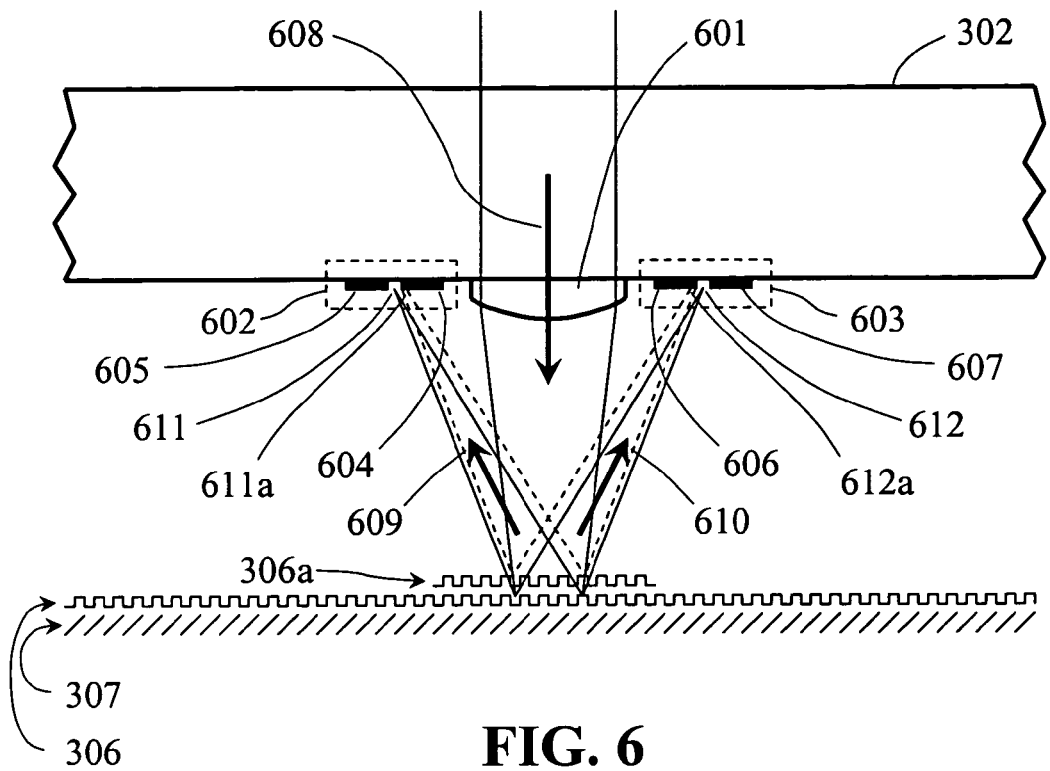
FIG. 6 illustrates a focus sensor mechanism.

A preferred embodiment of the focus sensor mechanism is illustrated cross-sectionally in FIG. 6. The mechanism is disposed on a printhead 302 and comprises a microlens 601 and one or more, preferably two, position-sensing optical detectors 602 and 603 proximate to microlens 601. (The microlens could potentially be a Fresnel lens or a diffractive Fresnel zone-plate lens, although a smooth-contoured refractive microlens would be preferred to mitigate stray light.) Each position-sensing detector is preferably a split detector comprising two proximate, intensity-sensing detector elements. For example, detector 602 comprises detector elements 604 and 605, and detector 603 comprises detector elements 606 and 607. A reflective diffraction grating 306 is disposed on a portion of a printing substrate 307 to serve as a focus reference. (This is preferably the same reference grating used for alignment tracking, cf. FIG. 3.) Collimated illumination 608 is focused by the microlens and is diffracted by the grating into two reflected beams 609 and 610. Beam 609 comes to a focus at spot 611 on or near the boundary between detector elements 604 and 605, and beam 610 comes to a focus at spot 612 on or near the boundary between detector elements 606 and 607.

As the focus position of grating 306 changes, the focus spots translate laterally on the detectors, resulting in imbalanced detector signals. For example, when the grating 306 moves upward to position 306a, the focus spots move from positions 611 and 612 to positions 611a and 612a, resulting in an increased signal from detector elements 604 and 606 and a decreased signal from detector elements 605 and 607. At the nominal best-focus position, the signals are balanced. Denoting the signal intensities from detector elements 604, 605, 606, and 607 as $I_1$, $I_2$, $I_3$, and $I_4$, respectively, a focus metric ("FM") can be defined as $$FM = \frac{I_1 - I_2 + I_3 - I_4}{I_1 + I_2 + I_3 + I_4}$$

A focus servomechanism would typically keep the focus metric set at zero, although in some applications the target focus position may need to be biased, for example, if there is a thick transparent film covering the reference grating.

The focus sensor illustrated in FIG. 6 is configured to be insensitive to small changes in the tilt of grating 306. Based on the symmetry of the optical configuration, a small tilt will increase the signal from either detector element 604 or 606, while decreasing the other element's signal by an equal amount, and will similarly have equal and opposite effect on the signals from detector elements 605 and 607; but the signal changes will cancel out in the focus metric. (The sensor could be used to simultaneously measure tilt and focus.)

Figure 7A:
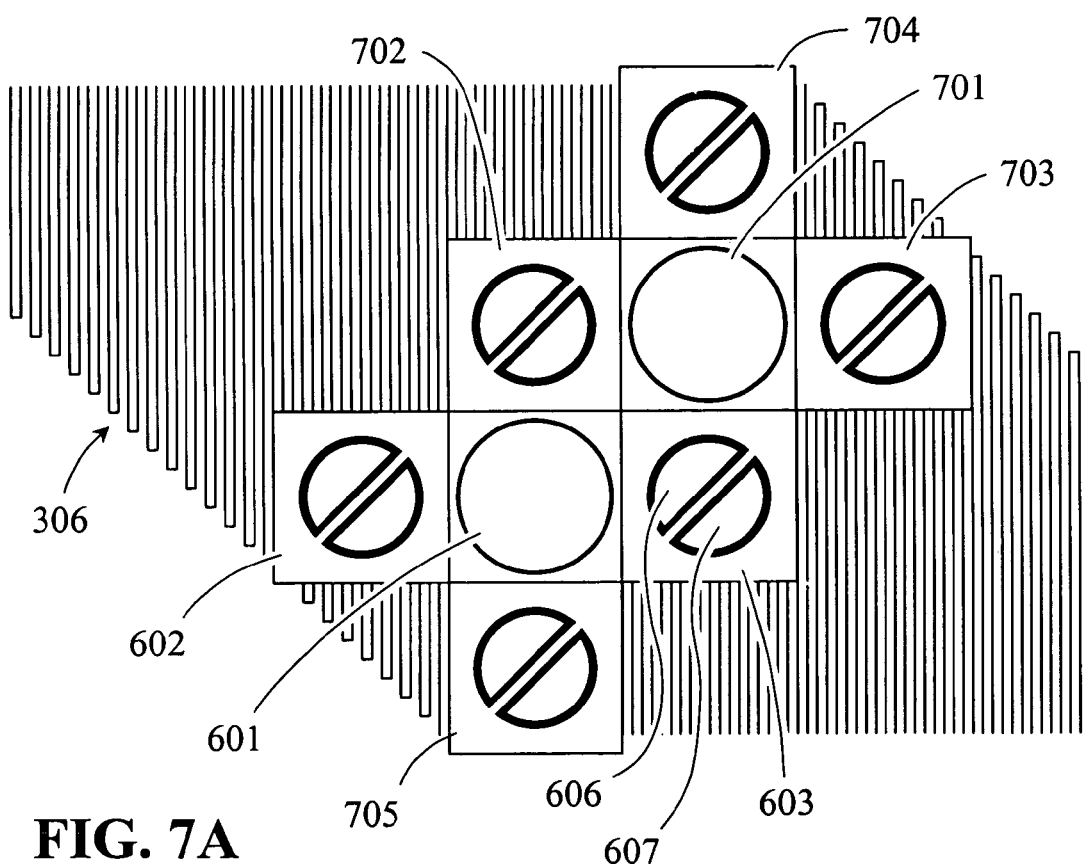
FIGS. 7A and 7B illustrate a focus sensor mechanism adapted to operate with reference gratings having either of two grating orientations.
Figure 7B:
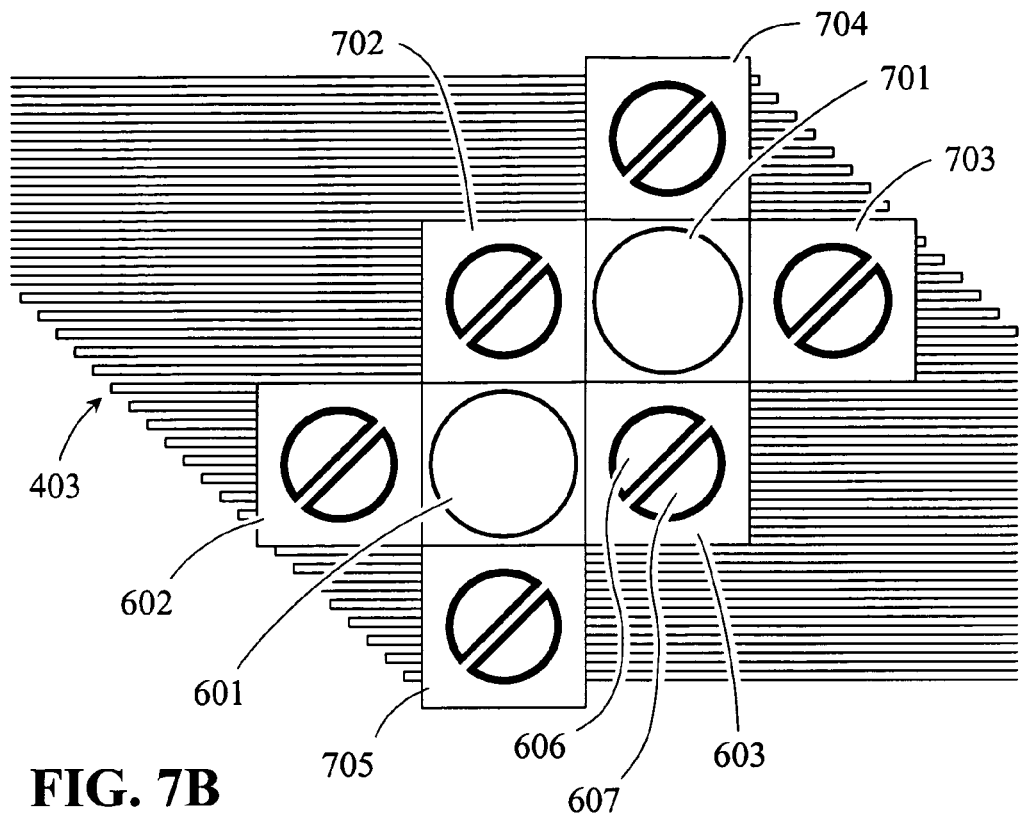

A focus sensor array can be configured to operate with a reference grating having either of two grating orientations, as illustrated in FIGS. 7A and 7B. FIG. 7A is plan view of a portion of the array, showing microlens 601, position-sensing optical detectors 602 and 603, and reference grating 306 of FIG. 6, and also showing additional array elements such as microlens 701 and position-sensing detectors 702, 703, 704 and 705. FIG. 7B shows the system with a second reference grating 403 having a line orientation transverse to grating 306. In FIG. 7A the illumination focused by microlens 601 is directed by grating 306 onto detectors 602 and 603 (as in FIG. 6), and the illumination focused by microlens 701 is similarly directed onto detectors 702 and 703. In FIG. 7B the illumination focused by microlens 601 is directed by grating 403 onto detectors 702 and 705, and the illumination focused by microlens 701 is similarly directed onto detectors 704 and 603.

The position-sensing optical detectors are oriented to detect the beams' positional displacements in a direction diagonal to the grating lines of both reference gratings. For example, if split detectors are used the detector elements of each split detector (e.g., elements 606 and 607 of detector 603; see FIG. 7A) are oriented so that the boundary line between the two elements is diagonal to the line orientations of both reference gratings 306 and 403. This ensures that the detector signals will be focus-sensitive with either grating. The microlenses could possibly be cylindrical lenses with their cylindrical axes transverse to the position-sensing direction (e.g., parallel to the boundary line between elements 606 and 607 in FIG. 7A). In this case the focused spot on each split detector would be a line focus transverse to the position-sensing direction, rather than a point focus.

Figure 8:
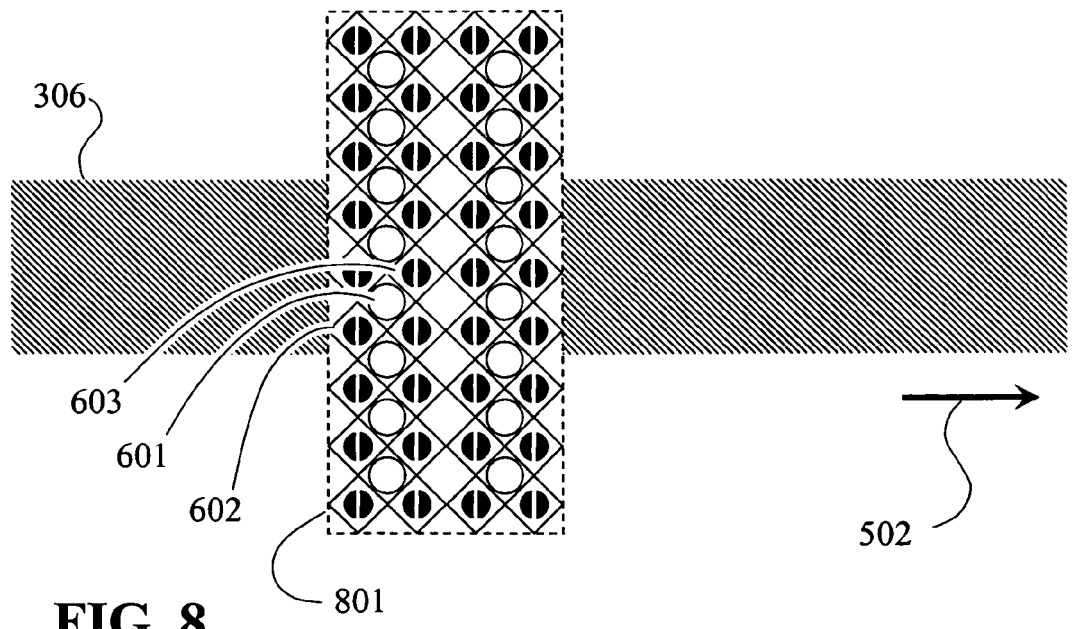
FIG. 8 illustrates a focus sensor array.

FIG. 8 illustrates a larger portion of the focus sensor array 801 positioned above reference grating 306. The sensors operate in conjunction with a positioning servomechanism to control focus as the printing substrate (or printhead) is scanned in direction 502.

Figure 9:
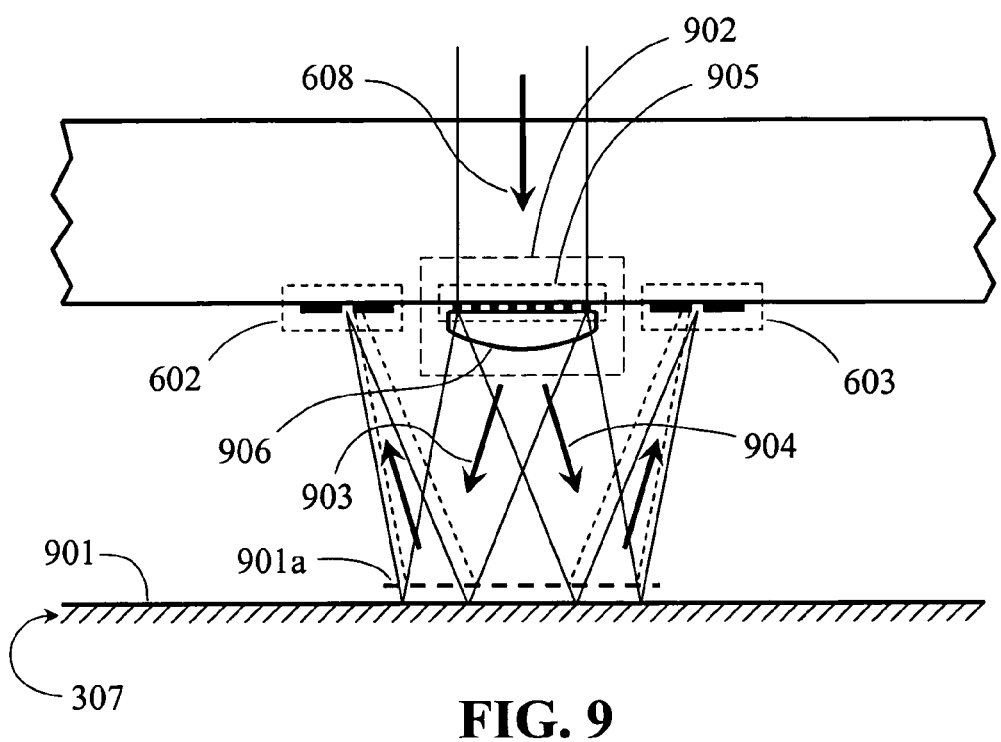
FIG. 9 illustrates an alternative focus sensor mechanism, which uses an unpatterned reflective surface as a focus reference.

FIG. 9 illustrates an alternative embodiment of the focus sensor that does not require a reference grating on the printing substrate 307—it only requires a reflective, unpatterned surface 901. The only difference from the FIG. 6 configuration is that the mechanism incorporates a focusing/beam-splitting component 902 in place of microlens 601. This component functions to focus and split incident illumination 608 into convergent beams 903 and 904, which reflect off surface 901 and come to focus on or near position-sensing detectors 602 and 603. Component 902 could, for example, comprise a diffraction grating 905 in series with a microlens 906; or it might comprise a single diffractive element that performs both the focusing and beam-splitting functions. FIG. 9 illustrates the beams' translational shift when surface 901 is vertically displaced to position 901a. (The preferred embodiment of FIG. 6 has advantages over the FIG. 9 embodiment, in that it has a simpler focus sensor, it does not need additional unpatterned surface area on the printing substrate as a focus reference, and for a given optical geometry its focus sensitivity would be twice that of the FIG. 9 embodiment.)

Figure 10:
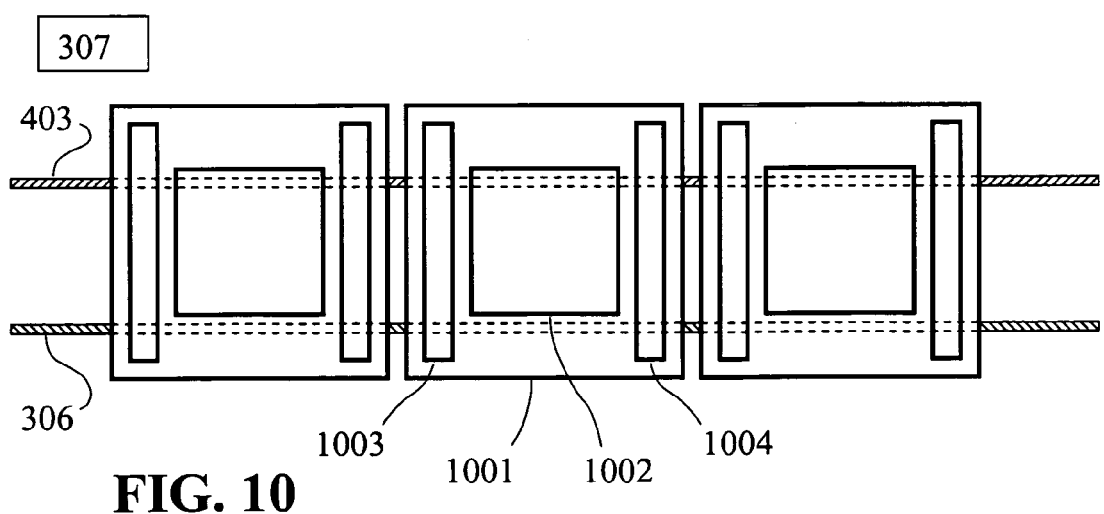
FIG. 10 illustrates several printheads comprising exposure microlens arrays and focus/alignment sensor arrays.

FIG. 10 illustrates a plan view of several printheads, such as printhead 1001, positioned above a printing substrate 307 bearing reference gratings 306 and 403. (For semiconductor applications the reference gratings would typically be formed in wafer scribe lines.) Printhead 1001 comprises an exposure microlens array 1002 and focus/alignment sensor arrays 1003 and 1004. The sensor arrays comprise sensor elements such as those illustrated in FIGS. 5 and 8. The alignment and focus sensor arrays may be interleaved to provide good spatial uniformity of the measurement sampling. FIG. 10 is similar to FIG. 3 in U.S. Pat. No. 6,498,685 (in which elements 201, 301, 303a and 303b correspond to the above-identified elements 1001, 1002, 1003 and 1004, respectively). The three printheads illustrated in FIG. 10 could represent a portion of a print module comprising a large array of printheads, which all operate in parallel to provide very high-throughput printing (e.g., see FIG. 5 in U.S. Pat. No. 6,498,685).

Figure 11:
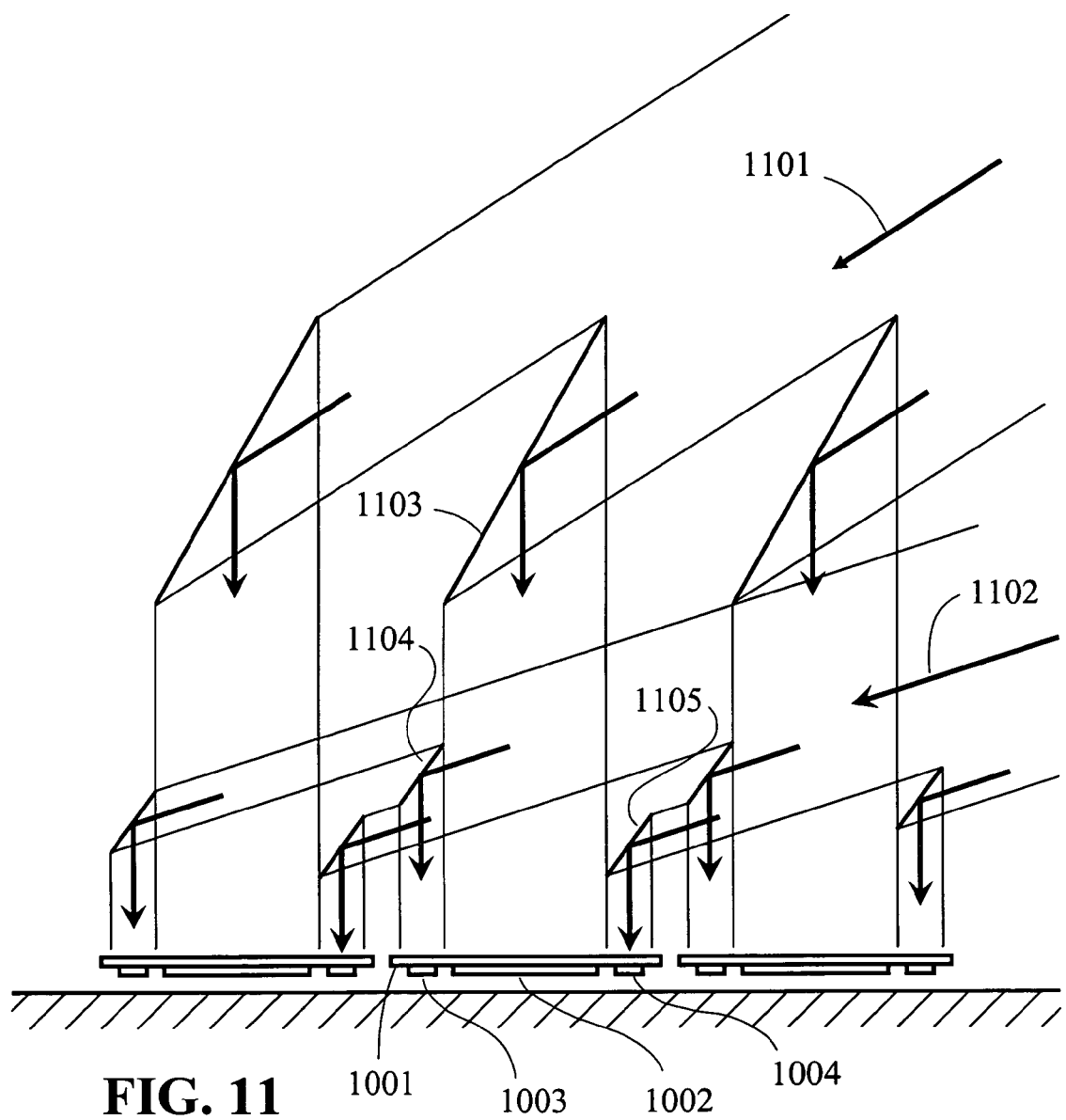
FIG. 11 illustrates the illumination optics for the exposure and sensor systems.

A cross-sectional view of the system is shown in FIG. 11, which illustrates a concept for the illumination system (cf. FIG. 4 in U.S. Pat. No. 6,498,685). Two illumination beams are provided: a large, collimated beam 1101 at the exposure wavelength, and a smaller collimated beam 1102 at the sensor wavelength. (In a typical photoresist patterning application the exposure wavelength would be UV or EUV, whereas the sensor system would use a visible wavelength that does not affect the resist.) A set of large fold mirrors divides the exposure beam 1101 into smaller beams illuminating individual printheads (e.g., mirror 1103 diverts illumination to the exposure microlens array 1002 on printhead 1001). Smaller fold mirrors divide the main sensor beam 1102 into smaller beams illuminating the sensor arrays (such as mirrors 1104 and 1105, which provide illumination to sensor arrays 1003 and 1004).

The position sensor mechanisms described above could be useful for metrology applications. For example, in an overlay metrology application the alignment sensors could simultaneously measure the detection system's positional alignment relative to each of two non-overlapping reference gratings formed on a measurement surface. The reference gratings would typically be formed in different process layers, and the difference of the two positional measurements would provide a measure of the overlay error between the two processes.

The sensors would also be used for system calibration. The sensor system would be calibrated by scanning high-quality reference gratings, which might typically be formed by interference lithography on an optical flat composed of low-expansion glass. The relative grating efficiencies and phase offsets of the alignment sensor gratings and the focus sensors' focus metrics would be characterized by this calibration. After completing the sensor calibration, a set of test grating patterns would be printed at different focus/exposure levels and would be analyzed by scanning the patterns with the sensor system (and perhaps also with stand-alone metrology tools) to calibrate the exposure optics. Calibration factors such as focus and alignment offsets would be determined to characterize the positional relationship between the sensor elements and the exposure microlenses' focal points, and these factors would subsequently be used by pattern generation algorithms to account for such positional relationships.

What is claimed is:

1. An alignment sensor for use with a reference grating disposed on a substrate, the alignment sensor comprising:
    first, second, third, and fourth sensor gratings; and
    an optical detector;
    said first, second, third, and fourth sensor gratings and said optical detector being disposed relative to one another such that:
    said first and second sensor gratings are laterally spaced on opposite sides of said detector along a first axis;
    said first and second sensor gratings have lines that extend in directions that are perpendicular to said first axis;
    said third and fourth sensor gratings are laterally spaced on opposite sides of said detector along a second axis that is perpendicular to said first axis;
    said third and fourth sensor gratings have lines that extend in directions that are perpendicular to said second axis;
    when said first and second sensor gratings receive illumination, each of said first and second sensor gratings diffracts at least some of the illumination into at least one obliquely transmitted beam directed at the reference grating;
    the reference grating receives two transmitted beams, one from each sensor grating, and diffracts the transmitted beams into a combined reflected beam; and
    said detector receives the reflected beam and produces an optical interference signal that is sensitive to the reference grating's lateral position relative to the alignment sensor.

2. A printhead incorporating the alignment sensor of claim 1 wherein:
    the alignment sensor is mounted on the printhead; and
    the substrate on which the reference grating is disposed is a printing substrate.

3. Apparatus for aligning a printhead with a printing substrate on which is disposed a reference grating, the apparatus comprising: first, second, third, and fourth sensor gratings disposed on the printhead;
    an optical detector disposed on the printhead; and
    an illumination source;
    said first and second sensor gratings, said optical detector, and said illumination source being disposed relative to one another such that:
    said first and second sensor gratings are laterally spaced on opposite sides of said detector along a first axis;
    said first and second sensor gratings have lines that extend in directions that are perpendicular to said first axis;
    said third and fourth sensor gratings are laterally spaced on opposite sides of said detector along a second axis that is perpendicular to said first axis;
    said third and fourth sensor gratings have lines that extend in directions that are perpendicular to said second axis;
    each of said first and second sensor gratings receives illumination and diffracts the illumination into at least one obliquely transmitted beam;
    the reference grating receives two transmitted beams, one from each of said first and second sensor gratings, and diffracts the two transmitted beams into a combined reflected beam; and
    said detector receives the reflected beam and produces an optical interference signal that is sensitive to the reference grating's lateral position relative to the printhead.

4. The apparatus of claim 3, and further comprising:
    an additional sensor grating disposed on the printhead; and
    an additional optical detector disposed on the printhead; wherein:
    said first-mentioned detector is located between said first and second sensor gratings so that said first-mentioned detector, said first sensor grating, and said second sensor grating define together a first alignment sensor;
    said additional detector is located between said second sensor grating and said additional sensor grating so that said additional detector, said second sensor grating, and said additional sensor grating define together an additional alignment sensor.

5. An alignment method for use with a reference grating disposed on a substrate, the alignment method comprising:
    illuminating first and second sensor gratings, laterally spaced along a first axis and having lines extending in directions that are perpendicular to the first axis, and third and fourth sensor gratings, laterally spaced along a second axis perpendicular to the first axis and having lines extending in directions perpendicular to the second axis, so that each sensor grating diffracts at least some of the incident illumination into at least one obliquely transmitted beam;
    directing four transmitted beams, one from each sensor grating, to a common region of the reference grating, whereupon the reference grating receives the four transmitted beams depending on the directions in which the reference grating's lines extend, and diffracts the first and second transmitted beams or the third and fourth transmitted beams into a combined reflected beam; and
    optically detecting the reflected beam to produce an interference signal that is sensitive to the reference grating's lateral position relative to the sensor gratings.

6. The method of claim 5, further comprising mounting the first and second sensor gratings on a printhead, and wherein said detection is performed by an optical detector mounted on the printhead.

7. A focus sensor for use with a reference grating disposed on a substrate, the focus sensor comprising:
   a microlens; and
   one or more position-sensing detectors;
   said microlens and said position-sensing detectors being disposed relative to one another such that:
   when said microlens receives illumination, said microlens focuses the illumination into a converging, transmitted beam;
   the reference grating receives the transmitted beam and diffracts the transmitted beam into one or more obliquely reflected beams;
   each position-sensing detector receives one of the reflected beams, which comes to a focus on or near that position-sensing detector; and
   said position-sensing detectors generate signals that are sensitive to translational shifts of the reflected beams induced by changes in separation distance between the reference grating and the focus sensor.

8. The focus sensor of claim 7 wherein each position-sensing detector is a split detector comprising two proximate, intensity-sensing detector elements.

9. A printhead incorporating the focus sensor of claim 7 wherein:
   the focus sensor is mounted on the printhead; and
   the substrate on which the reference grating is disposed is a printing substrate.

10. A focus sensor for use with a substrate, the focus sensor comprising:
    a focusing/beam-splitting component; and
    two or more position-sensing detectors;
    said focusing/beam-splitting component and position-sensing detectors being disposed relative to one another such that:
    when said focusing/beam-splitting component receives illumination, it generates two or more obliquely transmitted, converging beams;
    a surface on the substrate receives each transmitted converging beam and reflects it into an obliquely reflected beam;
    each position-sensing detector receives one of the reflected beams, which comes to a focus on or near that position-sensing detector; and
    said position-sensing detectors generate signals that are sensitive to translational shifts of the reflected beams induced by changes in separation distance between the surface on the substrate and the focus sensor.

11. The focus sensor of claim 10 wherein said focusing/beam-splitting component comprises a focusing microlens element and a beam-splitting grating element.

12. The focus sensor of claim 10 wherein each position-sensing detector is a split detector comprising two proximate, intensity-sensing detector elements.

13. A printhead incorporating the focus sensor of claim 10 wherein:
    the focus sensor is mounted on the printhead; and
    the substrate is a printing substrate.

14. Apparatus for sensing a printhead's focus position relative to a printing substrate on which is disposed a reference grating, the apparatus comprising:
    a microlens disposed on the printhead;
    one or more position-sensing detectors disposed on the printhead; and
    an illumination source;
    said microlens, said position-sensing detectors, and said illumination source being disposed relative to one another such that:
    said microlens receives illumination and focuses the illumination into a converging transmitted beam;
    the reference grating receives the transmitted beam and diffracts the transmitted beam into one or more obliquely reflected beams;
    each position-sensing detector receives one of the reflected beams, which comes to a focus on or near that position-sensing detector; and
    said position-sensing detectors generate signals that are sensitive to translational shifts of the reflected beams induced by changes in separation distance between the reference grating and the focus sensor.

15. The apparatus of claim 14 wherein each position-sensing detector is a split detector comprising two proximate, intensity-sensing detector elements.

16. Apparatus for sensing a printhead's focus position relative to a printing substrate on which is disposed a reflecting surface, the apparatus comprising:
    a focusing/beam-splitting component disposed on the printhead;
    two or more position-sensing detectors disposed on the printhead; and
    an illumination source;
    said focusing/beam-splitting component, said position-sensing detectors, and said illumination source being disposed relative to one another such that:
    said focusing/beam-splitting component receives illumination and focuses the illumination into two or more obliquely-transmitted, converging beams;
    the reflecting surface receives each transmitted, converging beam and reflects it into an obliquely reflected beam;
    each position-sensing detector receives one of the reflected beams, which comes to a focus on or near that position-sensing detector; and
    said position-sensing detectors generate signals that are sensitive to translational shifts of the reflected beams induced by changes in separation distance between the reflecting surface and the focus sensor.

17. The apparatus of claim 16 wherein said focusing/beam-splitting component comprises a focusing microlens element and a beam-splitting grating element.

18. The apparatus of claim 16 wherein each position-sensing detector is a split detector comprising two proximate, intensity-sensing detector elements.

19. A focus method for use with a reference grating disposed on a substrate, the focus method comprising:
    focusing incident illumination into a converging beam;
    directing the incident, converging beam toward the grating to generate one or more diffractively reflected beams traveling away from the substrate at oblique angles; and
    detecting light from the reflected beams with position-sensitive optical detectors, each detector being located near a corresponding reflected beam's focus, wherein the reflected beams' lateral positions on the detectors are sensitive to the grating's position relative to the incident beam.

20. The method of claim 19 wherein each position-sensing detector detects the corresponding reflected beam's lateral position by detecting the reflected beam's light intensity at two proximate, laterally separated locations on the detector, the relative intensities at the two locations being sensitive to the beam position.

21. The method of claim 19 wherein:
said focusing is accomplished by a focusing element; and
the method further comprises mounting the focusing element and the position-sensing detectors on a printhead.

22. A focus method for use with a substrate, the focus method comprising:
splitting and focusing incident illumination into two or more converging beams directed toward a reflective surface on the substrate to generate two or more corresponding, reflected beams traveling away from the substrate at oblique angles; and
detecting light from the reflected beams with position-sensitive optical detectors, each detector being located near a corresponding reflected beam's focus, wherein the reflected beams' lateral positions on the detectors are sensitive to the reflecting surface's position relative to the incident beam.

23. The method of claim 22 wherein each position-sensing detector detects the corresponding reflected beam's lateral position by detecting the beam's light intensity at two proximate, laterally separated locations on the detector, the relative intensities at the two locations being sensitive to the beam position.

24. The method of claim 22 wherein:
said splitting is accomplished by a diffraction grating;
said focusing is accomplished by a focusing element proximate to said grating; and
the method further comprises mounting the grating, the focusing element, and the position-sensing detectors on a printhead.

25. A focus method for use with a substrate, the focus method comprising:
focusing illumination toward the substrate;
splitting the illumination so that two or more converging beams are obliquely reflected from a surface on the substrate in different directions; and
detecting the lateral translational positions of the reflected beams to determine the surface's position relative to the focused illumination.

* * * * *